(12) United States Patent
Chen et al.

(10) Patent No.: US 7,869,217 B2
(45) Date of Patent: Jan. 11, 2011

(54) TOOLLESS LOCKING DEVICE

(75) Inventors: Chun-Chi Chen, Taipei Hsien (TW); Hong-Cheng Yang, Shenzhen (CN); Jin-Biao Liu, Shenzhen (CN); He-Ping Liu, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 130 days.

(21) Appl. No.: 12/202,391

(22) Filed: Sep. 1, 2008

(65) Prior Publication Data

US 2010/0053904 A1 Mar. 4, 2010

(51) Int. Cl.
*H05K 7/20* (2006.01)
*H01L 23/40* (2006.01)

(52) U.S. Cl. .............. 361/710; 361/709; 361/719; 361/679.54; 257/727; 165/80.2; 165/80.3

(58) Field of Classification Search ............... 361/719, 361/709, 710, 679.54; 257/727; 165/80.2, 165/80.3
See application file for complete search history.

(56) References Cited

U.S. PATENT DOCUMENTS

| | | | | |
|---|---|---|---|---|
| 5,870,286 | A * | 2/1999 | Butterbaugh et al. | 361/704 |
| 6,055,159 | A * | 4/2000 | Sun | 361/704 |
| 6,304,452 | B1 * | 10/2001 | Lo | 361/704 |
| 6,307,748 | B1 * | 10/2001 | Lin et al. | 361/704 |
| 6,331,937 | B1 * | 12/2001 | Bartyzel | 361/679.54 |
| 6,392,889 | B1 * | 5/2002 | Lee et al. | 361/704 |
| 6,475,030 | B1 * | 11/2002 | Chang | 439/557 |
| 6,545,879 | B1 * | 4/2003 | Goodwin | 361/807 |
| 6,557,675 | B2 * | 5/2003 | Iannuzzelli | 188/380 |
| 6,666,640 | B1 * | 12/2003 | Hsieh | 411/508 |
| 6,679,712 | B2 * | 1/2004 | Chang | 439/248 |
| 6,697,256 | B1 * | 2/2004 | Horng et al. | 361/704 |
| 6,786,691 | B2 * | 9/2004 | Alden, III | 411/371.2 |
| 6,826,054 | B2 * | 11/2004 | Liu | 361/719 |
| 6,930,884 | B2 * | 8/2005 | Cromwell et al. | 361/710 |
| 7,042,727 | B2 * | 5/2006 | Ulen et al. | 361/704 |
| 7,116,556 | B2 * | 10/2006 | Lee et al. | 361/704 |
| 7,126,823 | B2 * | 10/2006 | Chen et al. | 361/702 |
| 7,161,808 | B2 * | 1/2007 | Atkinson | 361/719 |
| 7,167,370 | B2 * | 1/2007 | Lee et al. | 361/719 |
| 7,180,743 | B2 * | 2/2007 | Chen et al. | 361/704 |
| 7,209,354 | B2 * | 4/2007 | Wu et al. | 361/697 |
| 7,342,796 | B2 * | 3/2008 | Aukzemas | 361/719 |

(Continued)

*Primary Examiner*—Anatoly Vortman
(74) *Attorney, Agent, or Firm*—Frank R. Niranjan

(57) ABSTRACT

A locking device is used for securing a heat sink to an electronic device mounted on a first face of a printed circuit board which defines a first hole. The heat sink defines a second hole therein. The locking device has a fastener including a head portion located aside the heat sink, a foot portion located aside a second face of the printed circuit board, and a body portion extending through the holes of the heat sink and the printed circuit board and interconnecting the head portion and the foot portion. The foot portion includes a buckling part abutting against the second face of the printed circuit board, and a positioning part extending towards the head portion to a position above the buckling part. When the buckling part abuts against the printed circuit board, the positioning part has a portion thereof entering into the first hole.

16 Claims, 6 Drawing Sheets

U.S. PATENT DOCUMENTS

| | | | |
|---|---|---|---|
| 7,359,200 B2 * | 4/2008 | Zhou et al. | 361/704 |
| 7,430,122 B2 * | 9/2008 | Li | 361/719 |
| 7,474,530 B2 * | 1/2009 | Stewart et al. | 361/704 |
| 7,474,532 B1 * | 1/2009 | Desrosiers et al. | 361/719 |
| 7,489,511 B2 * | 2/2009 | Yang | 361/704 |
| 7,576,989 B2 * | 8/2009 | Li et al. | 361/719 |
| 2004/0105236 A1 * | 6/2004 | Lee et al. | 361/704 |
| 2004/0253077 A1 * | 12/2004 | Aoki et al. | 411/508 |
| 2005/0111192 A1 * | 5/2005 | Lee et al. | 361/704 |
| 2006/0007659 A1 * | 1/2006 | Lee et al. | 361/704 |
| 2006/0275100 A1 * | 12/2006 | Aukzemas | 411/353 |
| 2007/0217159 A1 * | 9/2007 | Long et al. | 361/704 |
| 2008/0158827 A1 * | 7/2008 | Yang | 361/719 |

* cited by examiner

TOOLLESS LOCKING DEVICE

BACKGROUND OF THE INVENTION

1. Field of the Invention

The present invention relates to locking devices, and particularly to a locking device for securing a heat sink to an electronic device mounted on a printed circuit board.

2. Description of Related Art

It is well known that, during operation of a computer, electronic devices such as central processing units (CPUs) frequently generate large amounts of heat. The heat must be quickly removed from the electronic device to prevent it from becoming unstable or being damaged. Typically, a heat sink is attached to an outer surface of the electronic device to absorb heat from the electronic device. The heat absorbed by the heat sink is then dissipated to ambient air.

In order to keep the heat sink in intimate contact with the electronic device, a locking device is used to secure the heat sink to the electronic device. Referring to FIG. 6, a related locking device is shown. The locking device comprises two fasteners 10 for securing a heat sink 20 to an electronic device 40 mounted on a printed circuit board 30. Each fastener 10 comprises a pole 14, a head 12 located at an end of the pole 14, and a plug 16 located at an opposite end of the pole 14. A helical spring 18 circles the pole 14 between the head 12 and the plug 16. The plug 16 forms two barbs at two opposite sides thereof. In use, the plug 16 extends through a hole 24 defined in an ear 22 which extends from a side of the heat sink 20 and a hole 32 defined in the printed circuit board 30. At a bottom side of the printed circuit board 30, the barbs of the plug 16 abut against the printed circuit board 30. The spring 18 is located on the ear 22 of the heat sink 20 and presses the heat sink 20 to the electronic device 40. Therefore, the heat sink 20 is secured to and in contact with the electronic device 40. However, when detaching the heat sink 20 away from the electronic device 30, it needs a tool to converge the barbs of the plug 16 to enter into the hole 32 of the circuit board 30 and the hole 24 of the heat sink 20, which is very inconvenient. Otherwise, in order to detach the heat sink 20 from the electronic device 40, the plug 16 is cut away from the pole 14 by a tool, which causes a waste of the material and accordingly a higher cost.

What is needed, therefore, is a locking device conveniently securing\detaching a heat sink to\from an electronic device.

SUMMARY OF THE INVENTION

The present invention relates to a locking device. According to a preferred embodiment of the present invention, the locking device is used for securing a heat sink to an electronic device mounted on a first face of a printed circuit board. The printed circuit board has a second face opposite to the first face. The printed circuit board defines a first hole extending through the first face and the second face. The heat sink rests on the electronic device. The heat sink defines a second hole therein. The locking device has a fastener comprising a head portion, a foot portion and a body portion interconnecting the had portion and the foot portion. The head portion is located at a side of the heat sink. The foot portion is located at a side of the second face of the printed circuit board. The body portion extends through the second hole of the heat sink and the first hole of the printed circuit board and connects the head portion and the foot portion. The foot portion comprises a buckling part extending outwardly from a distal end of the body portion and abutting against the second face of the printed circuit board toward the heat sink, and a positioning part extending outwardly from the distal end of the body portion and extending upwardly toward the head portion to a position above the buckling part. The first hole of the printed circuit board comprises a first slot allowing the buckling part of the foot portion extending there through and a second slot allowing the positioning part of the foot portion extending there through. When the buckling part abuts against the second face of the printed circuit board, the positioning part has a portion thereof entering into the first slot. The bucking part has a length along a direction perpendicular to an axis of the body portion larger than that of the positioning part along a corresponding direction perpendicular to the axis of the body portion.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
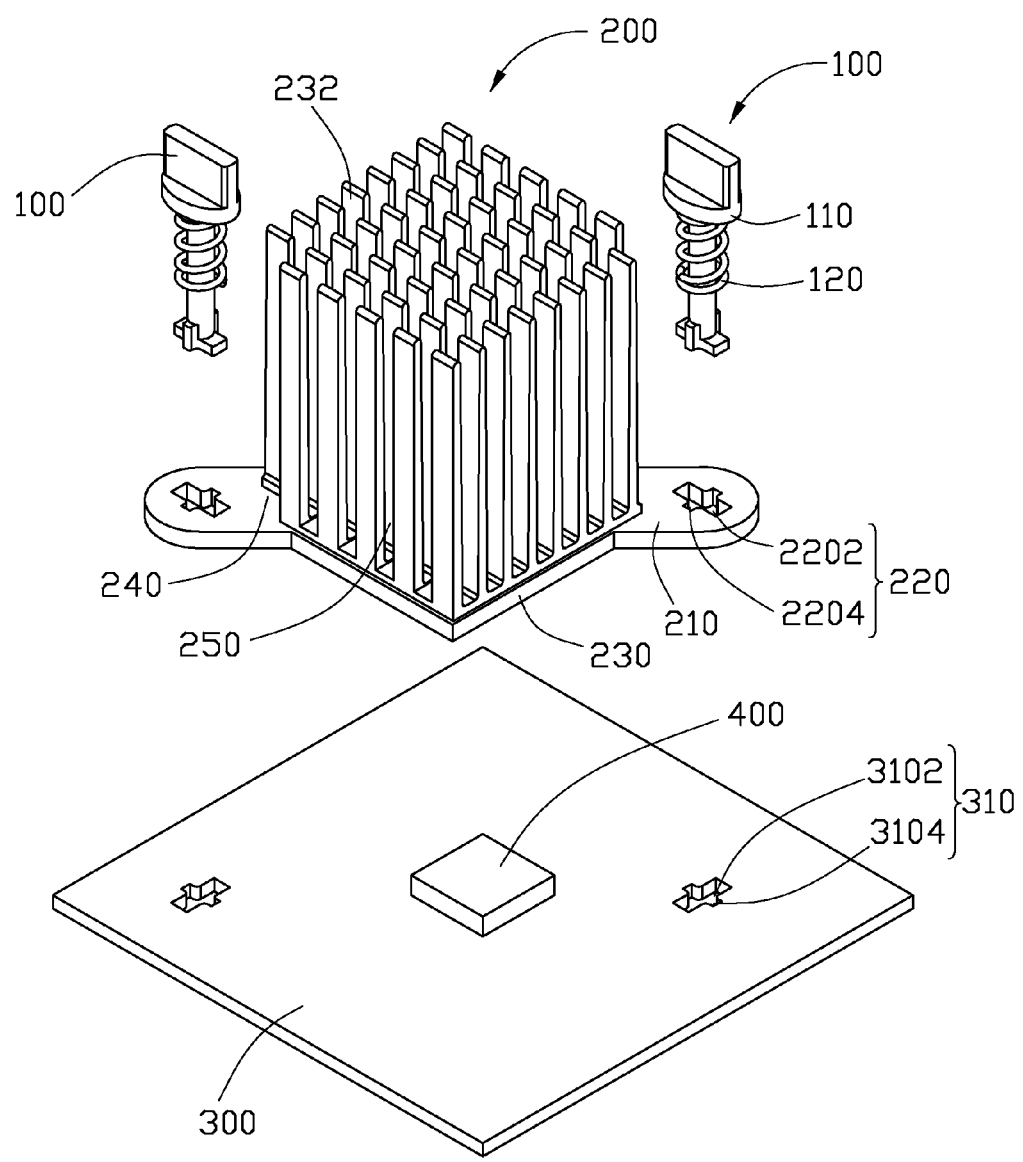
FIG. 1 is an isometric, exploded view of a locking device, a heat sink and a printed circuit board with an electronic device mounted thereon in accordance with a preferred embodiment of the present invention.
Figure 3:
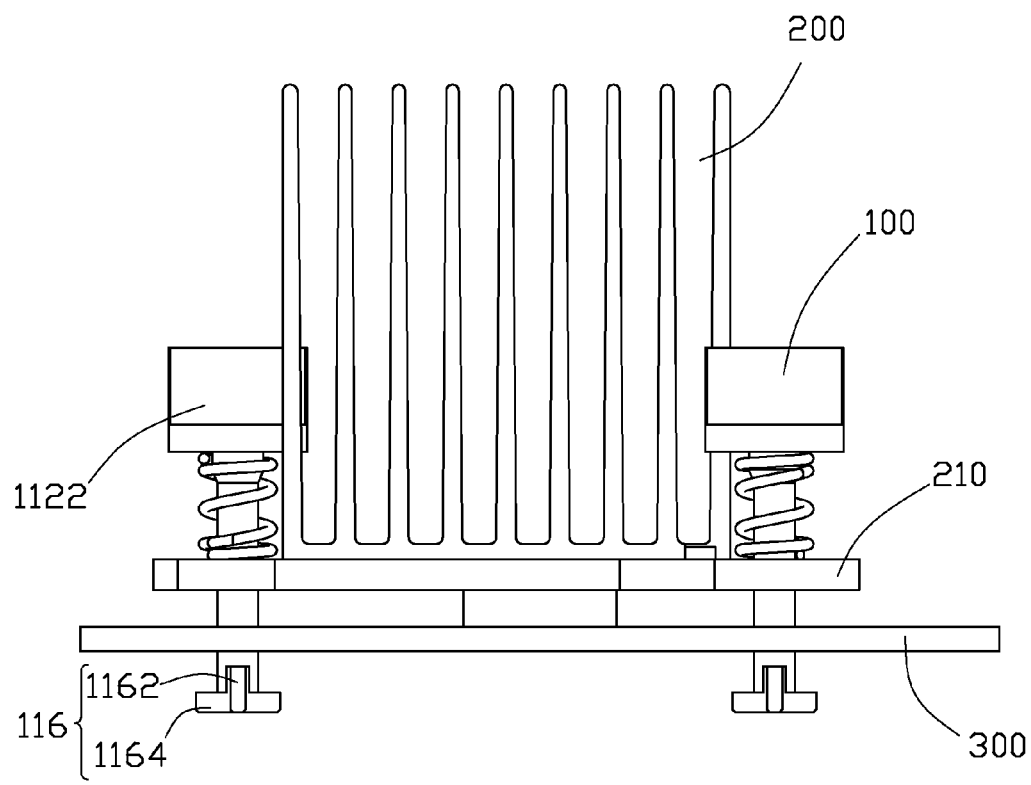
FIG. 3 is a plan view of the locking device assembled to and unlocked with the heat sink and the circuit board of FIG. 1.

FIGS. 1 and 3 illustrates a locking device for securing a heat sink 200 to an electronic device 400 mounted on a circuit board 300 in accordance with a preferred embodiment of the present invention. The locking device comprises two fasteners 100.

Figure 2:
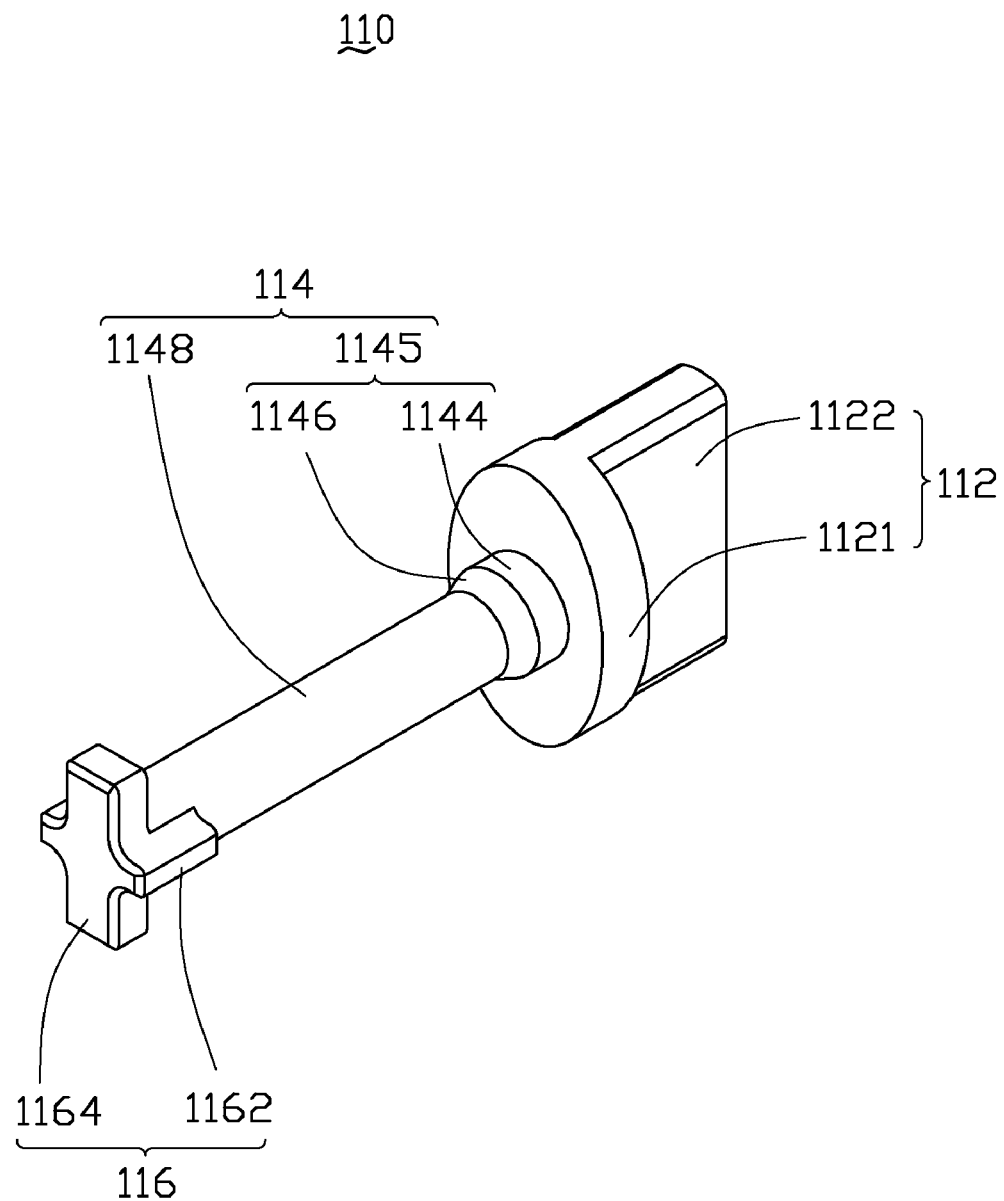
FIG. 2 shows a fastener of the locking device of FIG. 1.

Referring also to FIG. 2, each fastener 100 comprises a shaft member 110 and a helical spring 120 circling the shaft member 110. The shaft member 110 is integrally made from plastic or metallic material. The shaft member 110 comprises a body portion 114, a head portion 112 formed at a top end of the body portion 114, and a foot portion 116 formed at an opposite bottom end of the body portion 114. The head portion 112 comprises an elliptic chassis 1121 and a flattened handle 1122 vertically and upwardly extending from a central portion of the chassis 1121. The body portion 114 comprises a shank section 1148 and a connecting section 1145 connecting the shank section 1148 and the chassis 1121. The connecting section 1145 has a diameter larger than that of the shank section 1148. The connecting section 1145 has a column part 1144 connecting with the chassis 1121 and a frustum-shaped part 1146 tapered from the column part 1144 to the shank section 1148. The foot portion 116 comprises a pair of opposite bucking parts 1164 and a pair of opposite positioning parts 1162 extending outwardly from a distal end of the shank section 1148. The buckling parts 1164 are alternate with the positioning parts 1162. The buckling parts 1164 and the positioning parts 1162 are interconnecting with each other and have bottom faces thereof being coplanar. The buckling parts 1164 and the positioning parts 1162 have projections cooperatively defining a crossed configuration at the distal bottom end of the shank section 1148. Each of the buckling parts 1164 has a length in a radial direction of the shank section 1148 larger than that of each of the positioning parts 1162 in a corresponding radial direction of the shank section 1148. Each of the positioning parts 1162 has a length in the axial direction of the shank section 1148 larger than that of each of the buckling parts 1164, and has an upper portion thereof projecting upwardly beyond the buckling parts 1164. In this embodiment, each of the buckling parts 1164 has a width in a direction perpendicular to the radial direction larger than that of each of the positioning parts 1162. The foot portion 116 has a bottom end thereof tapered downwardly to form a guiding edge (not labeled). The spring 120 is located between the positioning parts 1162 and the chassis 1121.

Referring to FIG. 1, the heat sink 200 comprises a base 230 and a plurality of fins 232 arranged on the base 230. The base 230 extends two ears 210 outwardly from two diagonally opposite corners thereof. The ears 210 extend outwardly beyond the fins 232. Each ear 210 defines a first cross hole 220 adjacent to a distal end thereof and extending vertically through the ear 210. The first cross hole 220 has a figure basically identical to and slightly larger than that of the foot portion 116. The first cross hole 220 comprises a first trough 2202 for allowing extension of the buckling parts 1164 of the foot portion 116 and a second trough 2204 for allowing extension of the positioning parts 1162 of the foot portion 116. The first trough 2202 is crossed with and perpendicular to the second trough 2204. The fins 232 define two spaces 240 adjacent to corresponding ears 210 for facilitating operation of the fasteners 100. A plurality of airflow passages 250 is defined between the fins 232.

The printed circuit board 300 defines two second cross holes 310 at two sides of the electronic device 400 and corresponding to the first cross holes 220 of the heat sink 200. Each second cross hole 310 comprises a first slot 3102 for allowing extension of the buckling parts 1164 of the foot portion 116, and a second slot 3104 for allowing extension of the positioning parts 1162 of the foot portion 116. The first slot 3102 is crossed with and perpendicular to the second slot 3104.

Figure 4:
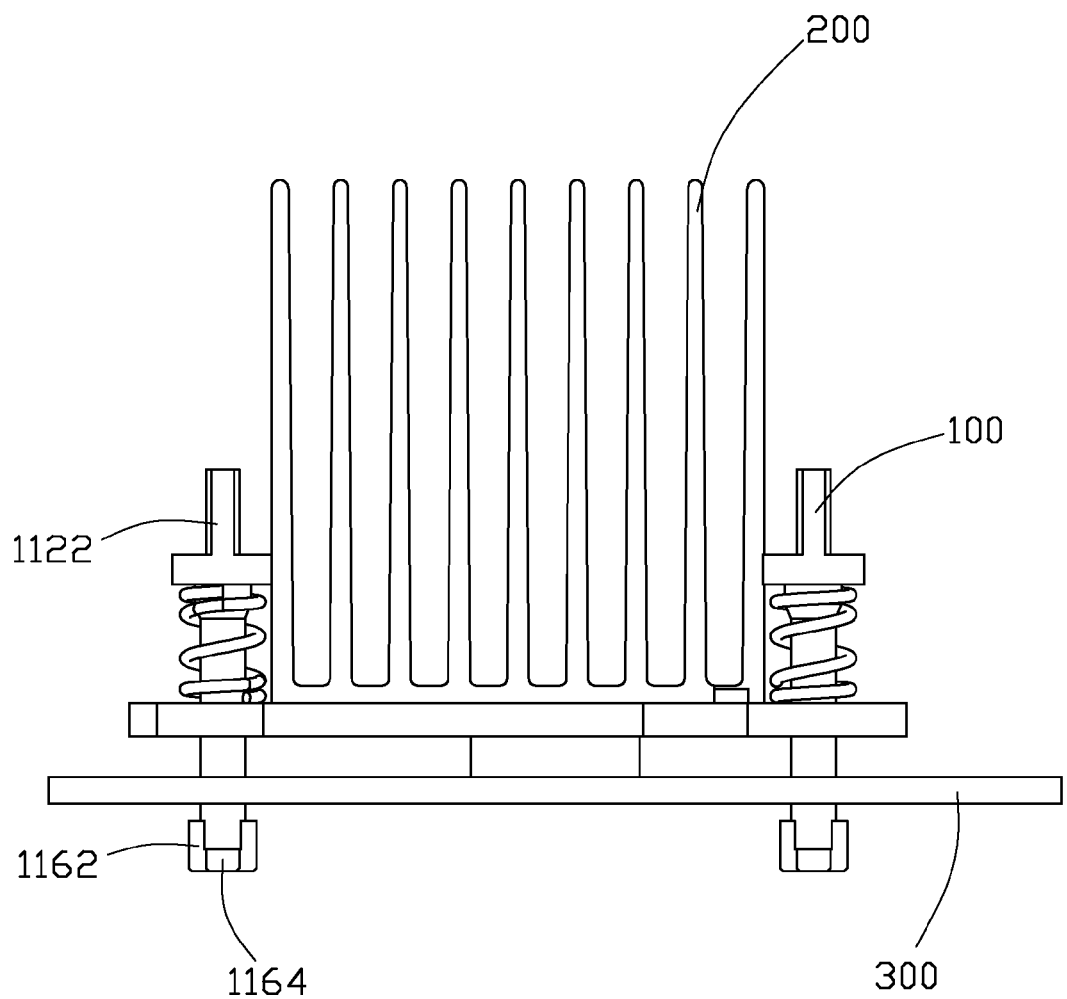
FIG. 4 is a plan view of the locking device assembled to and unlocked with the heat sink and the circuit board of FIG. 3, wherein the locking device is rotated.
Figure 5:
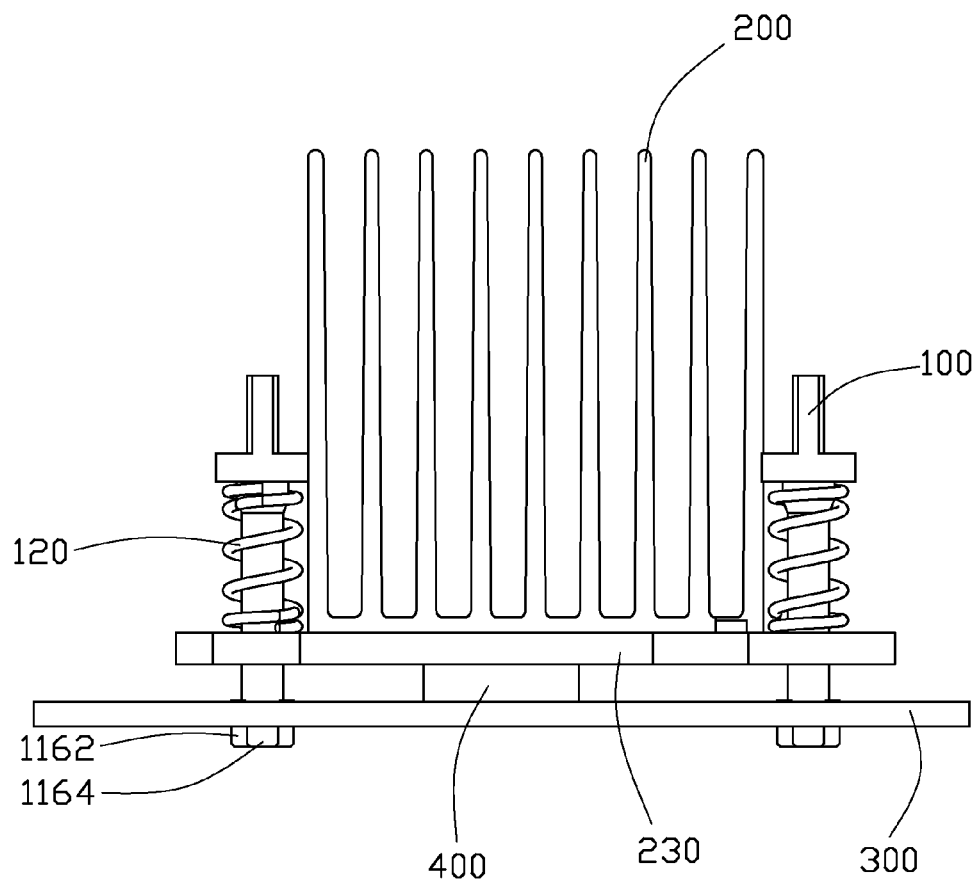
FIG. 5 is a plan view of the locking device assembled to and locked with the heat sink and the circuit board of FIG. 4.
Figure 6:
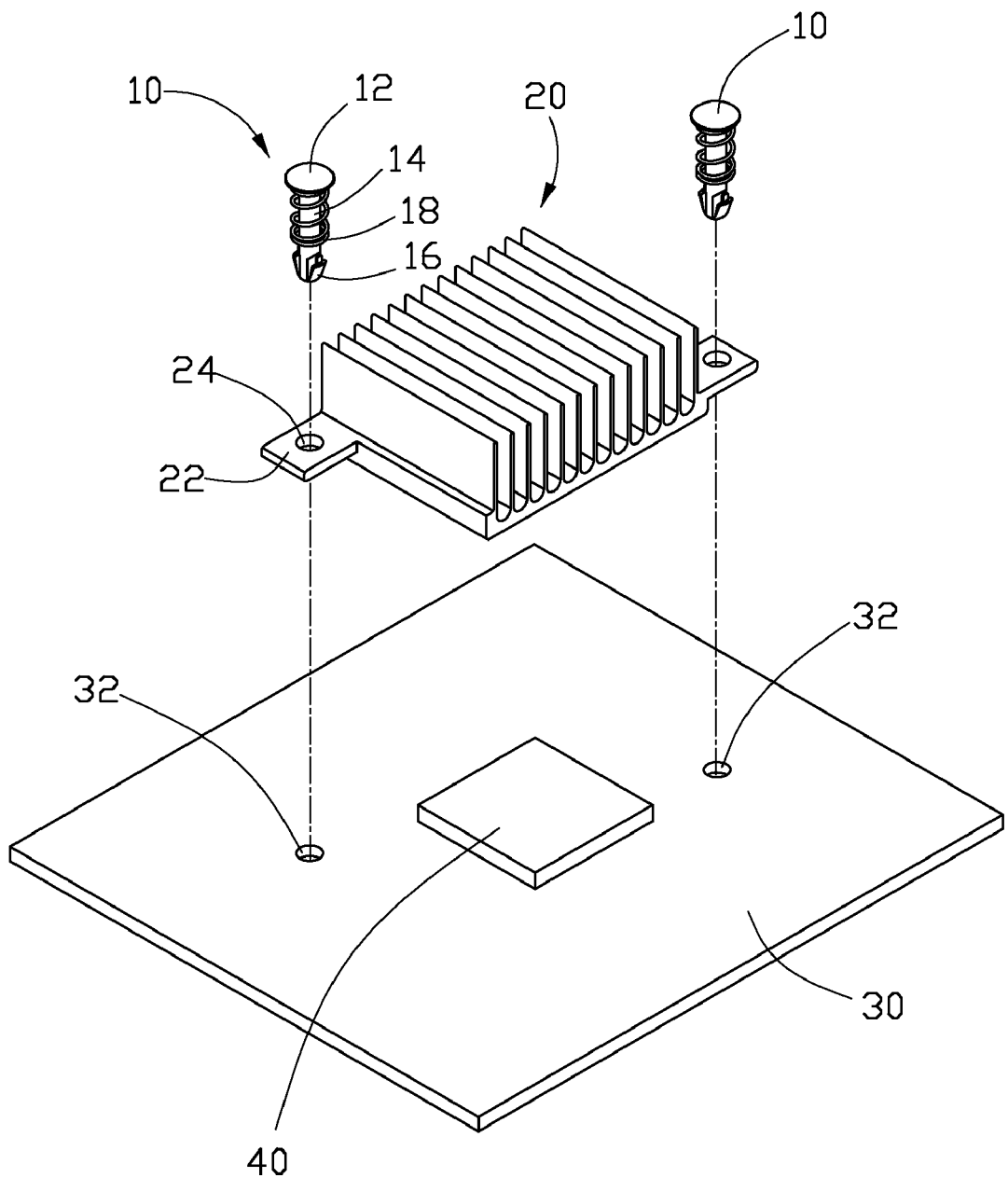
FIG. 6 is an exploded view of a locking device with a heat sink and a circuit board in a relate art.

Referring also to FIGS. 3-5, when the heat sink 200 is assembled to the electronic device 400, the heat sink 200 seats on the electronic device 400 and has the first cross holes 220 thereof in line with the second cross holes 310 of the printed circuit board 300; here, the first trough 2202 of the first cross hole 220 is aligned with a corresponding second slot 3104 and perpendicular to a corresponding first slot 3102 of a corresponding second cross hole 310. The fasteners 100 have the foot portions 116 inserted through corresponding first cross holes 220 of the heat sink 200. The fasteners 100 are pressed and then rotated 90 degrees by operating the handles 1122 thereof to make the foot portions 116 of the fasteners 100 fittingly aligned with the second cross holes 310 of the printed circuit board 300. The fasteners 100 are then further pressed to cause the foot portions 116 of the fasteners 100 to enter into the second cross holes 310 of the printed circuit board 300. And the foot portions 116 pass through the second cross holes 310 and are located under a bottom face of the printed circuit board 300, and the spring 120 are compressed; here, the fasteners 100 are located in a first unlocked position as shown in FIG. 3. At this position, the buckling parts 1164 of the foot portions 116 are corresponding to the first slots 3102 of the second cross holes 310, and the positioning parts 1162 of the foot portions 116 are located below and corresponding to the second slots 3104 of the second cross holes 310. The fasteners 100 are then rotated 90 degrees; here, the fasteners 100 are located in a second unlocked position as shown in FIG. 4 shown. At this position, the buckling parts 1164 of the foot portions 116 are corresponding to the second slots 3104 of the second cross holes 310, and the positioning parts 1162 of the foot portions 116 are located below and corresponding to the first slots 3102 of the second cross holes 310. Finally, the pressing force on the fasteners 100 is removed; the springs 120 expand and drive the foot portions 116 of the fasteners 100 to move upward toward the bottom face of the printed circuit board 300; by this, the buckling parts 1164 of the foot portions 116 abut against the bottom face of the printed circuit board 300; the positioning parts 1162 of the foot portions 116 have the upper portions thereof entering into the first slots 3102 of the second cross holes 310 of the printed circuit board 300. The fasteners 300 are accordingly located in a locked position as shown in FIG. 5, whereby the heat sink 200 is intimately secured to the electronic device 400.

When removing the heat sink 200 from the electronic device 400, the fasteners 100 are pressed and rotated 90 degrees to make the positioning parts 1162 located below the second slots 3104 of the second cross holes 310, and the buckling parts 1164 located below the first slots 3102 of the second cross holes 310; here, the fasteners 100 are located in the position as shown in FIG. 4. The pressing force on the fasteners 100 are lessened then, and under a spring force of the springs 120, the foot portions 116 move upwardly to leave from the second cross holes 310 and reach a position between the ears 210 and the printed circuit board 300; here, the heat sink 200 can be removed from the electronic device 400.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A locking device for fastening a first member to a second member, the locking device comprising:

a fastener comprising a head portion, a foot portion and a body portion interconnecting the head portion and the foot portion, the foot portion comprising a buckling part extending outwardly from an end of the body portion and a positioning part extending outwardly from the end of the body portion, the buckling part having a length along a direction perpendicular to an axis of the body portion larger than that of the positioning part along a corresponding direction perpendicular to the axis of the body portion, the positioning part having a portion extending toward the head portion to a position above the buckling part; and a spring surrounding the body portion and located between the head portion and the foot portion of the fastener;

wherein the fastener is in a locked state to secure the first member with the second member when the spring is compressed between the head portion of the fastener and the first member and the foot portion extends through the first member and the second member and is rotated to make the buckling part abut against the second member, and the fastener is in an unlocked state when the first member can be removed from the second member when the buckling part is rotated and then moved in a direction from the second member toward the first member to exit from the second member; and wherein the positioning part of the foot portion of the fastener has a length along the axis of the body portion larger than that of the buckling part of the foot portion.

2. The locking device of claim 1, wherein the head portion of the fastener comprises a chassis formed adjacent to an end of the body portion and a handle vertically extending from the chassis, the chassis having a diameter larger than that of the body portion.

3. The locking device of claim 2, wherein the spring is compressed between the chassis of the head portion and the first member when the fastener is in the locked state.

4. The locking device of claim 1, wherein the foot portion of the fastener further comprises another buckling part having a structure similar to that of the aforesaid buckling part and extending from the end of the body portion in a direction opposite to the aforesaid buckling part and another positioning part having a structure similar to that of the aforesaid positioning part and extending from the end of the body portion in a direction opposite to the aforesaid positioning part.

5. The locking device of claim 4, wherein the buckling parts are alternate with the positioning parts of the foot portion.

6. The locking device of claim 5, wherein the buckling parts and the positioning parts of the foot portion of the fastener have bottom faces, and the bottom faces are coplanar with each other.

7. The locking device of claim 4, wherein the foot portion of the fastener has a crossed profile which is cooperatively defined by the buckling parts and the positioning parts.

8. The locking device of claim 1, wherein an upper portion of the positioning part, which faces the head portion, is received in a slot defined in the second member to prevent rotations of the fastener when the fastener is in the locked state.

9. The locking device of claim 2, wherein the handle is flattened, and a width of the handle is larger than the diameter of the body portion.

10. A locking device for fastening a first member to a second member, the locking device comprising:
a fastener comprising a head portion, a foot portion and a body portion interconnecting the head portion and the foot portion, the foot portion comprising a buckling part extending outwardly from an end of the body portion and a positioning part extending outwardly from the end of the body portion, the buckling part having a length along a direction perpendicular to an axis of the body portion larger than that of the positioning part along a corresponding direction perpendicular to the axis of the body portion, the positioning part having a portion extending toward the head portion to a position above the buckling part; and
a spring surrounding the body portion and located between the head portion and the foot portion of the fastener;
wherein the fastener is in a locked state to secure the first member with the second member when the spring is compressed between the head portion of the fastener and the first member and the foot portion extends through the first member and the second member and is rotated to make the buckling part abut against the second member, and the fastener is in an unlocked state when the first member can be removed from the second member when the buckling part is rotated and then moved in a direction from the second member toward the first member to exit from the second member;
wherein the foot portion of the fastener further comprises another buckling part having a structure similar to that of the aforesaid buckling part and extending from the end of the body portion in a direction opposite to the aforesaid buckling part and another positioning part having a structure similar to that of the aforesaid positioning part and extending from the end of the body portion in a direction opposite to the aforesaid positioning part;
wherein the buckling parts are alternate with the positioning parts of the foot portion; and
wherein the buckling parts and the positioning parts of the foot portion of the fastener have bottom faces, and the bottom faces are coplanar with each other.

11. The locking device of claim 10, wherein the positioning part of the foot portion of the fastener has a length along the axis of the body portion larger than that of the buckling part of the foot portion.

12. The locking device of claim 10, wherein the head portion of the fastener comprises a chassis formed adjacent to an end of the body portion and a handle vertically extending from the chassis, the chassis having a diameter larger than that of the body portion.

13. The locking device of claim 12, wherein the spring is compressed between the chassis of the head portion and the first member when the fastener is in the locked state.

14. The locking device of claim 12, wherein the handle is flattened, and a width of the handle is larger than the diameter of the body portion.

15. The locking device of claim 10, wherein the foot portion of the fastener has a crossed profile which is cooperatively defined by the buckling parts and the positioning parts.

16. The locking device of claim 10, wherein an upper portion of the positioning part, which faces the head portion, is received in a slot defined in the second member to prevent rotations of the fastener when the fastener is in the locked state.

* * * * *